United States Patent
Yamaoka et al.

(12) 
(10) Patent No.: US 6,603,363 B1
(45) Date of Patent: Aug. 5, 2003

(54) OSCILLATOR AND OSCILLATOR ADJUSTMENT METHOD WITH STEPWISE DELAY

(75) Inventors: Nobusuke Yamaoka, Chiba (JP); Ichiro Okamoto, Tokyo (JP); Takehiko Saito, Kanagawa (JP); Yasutaka Kotani, Tokyo (JP); Kenji Nikata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/688,414

(22) Filed: Oct. 16, 2000

(30) Foreign Application Priority Data

Oct. 18, 1999 (JP) ............................................. 11-295929

(51) Int. Cl.$^7$ ............................................. H03L 7/099
(52) U.S. Cl. ....................... 331/57; 331/177 R; 331/34; 327/158
(58) Field of Search ................................ 331/57, 177 R, 331/25, 34, 27; 327/116, 119, 158

(56) References Cited

U.S. PATENT DOCUMENTS 5,739,725 A * 4/1998 Ferraiolo et al. .............. 331/57
6,075,415 A * 6/2000 Milton et al. .................. 331/25
6,259,330 B1 * 7/2001 Arai ............................. 331/57

* cited by examiner

Primary Examiner—Arnold Kinkead
(74) Attorney, Agent, or Firm—Frommer Lawrence & Haug LLP; William S. Frommer; Stephen J. Lieb (57) ABSTRACT

There are provided the delay coarse adjustment circuit 3, the delay fine adjustment circuit 4, and the inverter circuit 5. The delay coarse adjustment circuit 3 stepwise varies a delay amount based on the delay coarse adjustment signal S11 and supplies the input oscillation signal S12 with a coarse delay. The delay fine adjustment circuit 4 stepwise varies a delay amount based on the delay fine adjustment signal S2 and supplies the input oscillation signal S13 with a fine delay which is smaller than a delay amount supplied by the delay coarse adjustment circuit 3. The inverter circuit 5 inputs the oscillation signal S14 from the delay coarse adjustment circuit 3 or the delay fine adjustment circuit 4. The delay coarse adjustment circuit 3 coarsely adjusts delays. The delay fine adjustment circuit 4 fine adjusts delays. The coarse and fine adjustments provide a precision delay to generate the oscillation output signal S15. The delay coarse adjustment circuit 3, the delay fine adjustment circuit 4, and the inverter circuit 5 are connected in a ring for stepwise controlling an oscillation signal's oscillation frequency.

6 Claims, 5 Drawing Sheets

FIG.4A OSCILLATION OUTPUT
FIG.4B FIXED DELAY CIRCUIT OUTPUT
FIG.4C DELAY COARSE ADJUSTMENT CIRCUIT OUTPUT
FIG.4D DELAY FINE ADJUSTMENT CIRCUIT OUTPUT
FIG.4E FIRST DFF OUTPUT
FIG.4F SECOND DFF OUTPUT

FIG.5

OSCILLATOR AND OSCILLATOR ADJUSTMENT METHOD WITH STEPWISE DELAY

BACKGROUND OF THE INVENTION

1. Field of the Invention

The present invention relates to an oscillator and an oscillation method for generating an oscillation signal used as a synchronization signal, say, during data recording or reproduction by controlling oscillation frequencies.

2. Prior Art

When data is recorded to or reproduced from a tape storage medium, an operation references a synchronization signal having a specified sampling frequency. Namely, when data is recorded to or reproduced from a tape storage medium, a recording track is written or read at a write or read timing indicated by the synchronization signal with the specified sampling frequency.

Figure 5:
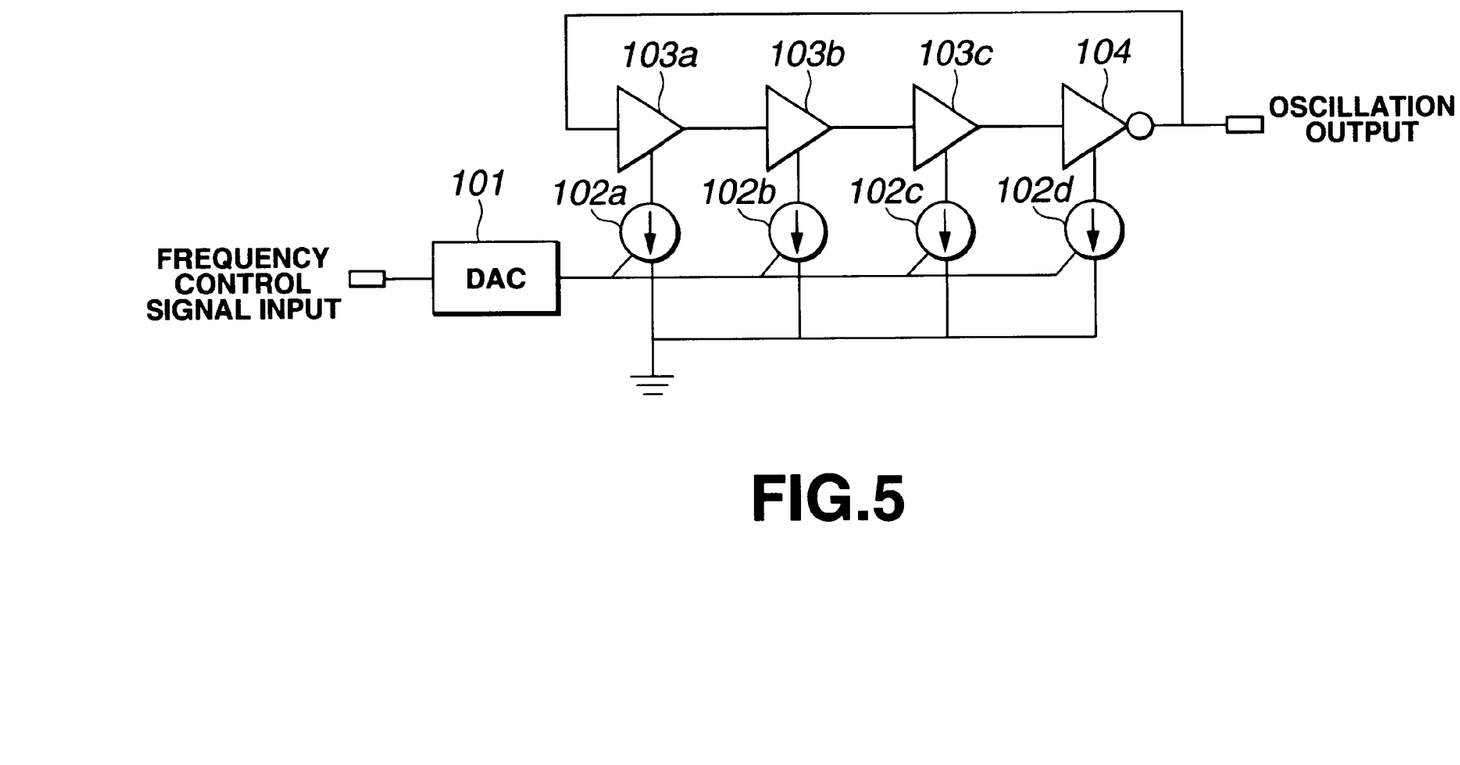
FIG. 5 is a block diagram showing a conventional signal generator.

Conventionally, a signal generation circuit as shown in FIG. 5 is often used for generating synchronization signals. The-signal generation circuit in FIG. 5 adjusts signal delays and controls frequencies in buffers 103a through 103c and an inverter 104 which are connected in a ring. Thereby, the signal generation circuit uses a D/A converter (referred to hereafter as the DAC) 101 to convert a digital frequency control signal into an analog value. The converted analog value is input to current sources 102a through 102d to vary current values. Thus, the signal generation circuit controls an output timing of the generated synchronization signal to use the synchronization signal as an oscillation output.

Owing to rapid development of the integrated circuit technology in recent years, however, swift alternations are made to generations of processes for manufacturing digital LSIs (Large Scale Integrated Circuits). Each time the process changes, there has been a need for developing a new analog cell for handling analog signals as shown in FIG. 5. There arises the problem of prolonging a term for developing apparatuses including the signal generation circuit connected to the digital LSI chip and increasing manufacturing costs.

BRIEF SUMMARY OF THE INVENTION

The present invention has been made in consideration of the foregoing. It is therefore an object of the present invention to provide an oscillator and an oscillation method which can decrease manufacturing costs by generating an oscillation signal without converting a digital signal to an analog signal.

An oscillator according to the present invention for solving the above-mentioned problems comprises a delay coarse adjustment circuit, a delay fine adjustment circuit, and an inverter circuit. The delay coarse adjustment circuit supplies a coarse delay to an input oscillation signal of which delay amount varies stepwise based on a delay coarse adjustment signal. The delay fine adjustment circuit supplies a fine delay to an input oscillation signal of which delay amount varies stepwise based on a delay fine adjustment signal. The fine delay is smaller than a delay amount supplied in the delay coarse adjustment circuit. The inverter circuit is supplied with the oscillation signal which passes the delay coarse adjustment circuit and the delay fine adjustment circuit. By having these circuits, the oscillator coarsely adjusts delays in the delay coarse adjustment circuit and fine adjusts delays in the delay fine adjustment circuit.

The oscillator stepwise controls an oscillation frequency of the oscillation signal by connecting the delay coarse adjustment circuit, the delay fine adjustment circuit, and the inverter circuit in a ring.

An oscillation method according to the present invention stepwise varies a delay amount in the delay coarse adjustment circuit based on the delay coarse adjustment signal and supplies a coarse delay to the oscillation signal. The oscillation method stepwise varies a delay amount in the delay fine adjustment circuit based on the delay fine adjustment signal and supplies a fine delay to the oscillation signal. The fine delay has a smaller delay amount than the coarse delay.

The oscillation method stepwise controls an oscillation frequency of the oscillation signal by letting it more than once pass the delay coarse adjustment circuit, the delay fine adjustment circuit, and the inverter circuit which are connected in a ring.

As mentioned above in detail, the oscillator according to the present invention uses the delay adjustment circuits for coarsely adjusting delays. When fine adjusting delays in the delay fine adjustment circuit, the oscillator stepwise varies coarse and fine adjustments of delays. Additionally, the oscillator stepwise controls an oscillation signal's oscillation frequency by connecting the delay coarse adjustment circuit, the delay fine adjustment circuit, and the inverter circuit in a ring. Therefore, the oscillator can operate just by using digital signals and generate oscillation signals without converting a digital signal into an analog signal. Accordingly, the oscillator can be easily mounted on a digital LSI chip and the like and decrease manufacturing costs.

Further, an oscillation method according to the present invention stepwise varies a delay amount in the delay coarse adjustment circuit based on the delay coarse adjustment signal and supplies a coarse delay to the oscillation signal. The oscillation method stepwise varies a delay amount in the delay fine adjustment circuit based on the delay fine adjustment signal and supplies a fine delay to the oscillation signal. This time, the oscillation method stepwise varies a delay and controls an oscillation frequency of the oscillation signal by letting it more than once pass the delay coarse adjustment circuit, the delay fine adjustment circuit, and the inverter circuit which are connected in a ring. Therefore, the oscillation method can handle only digital signals and generate oscillation signals without converting a digital signal into an analog signal. Accordingly, the oscillation method can easily allow a processing block for generating oscillation signals to be mounted on a digital LSI chip and decrease manufacturing costs.

DETAILED DESCRIPTION OF THE INVENTION

Embodiments of the present invention will be described in detail, with reference to the accompanying drawings.

Figure 1:
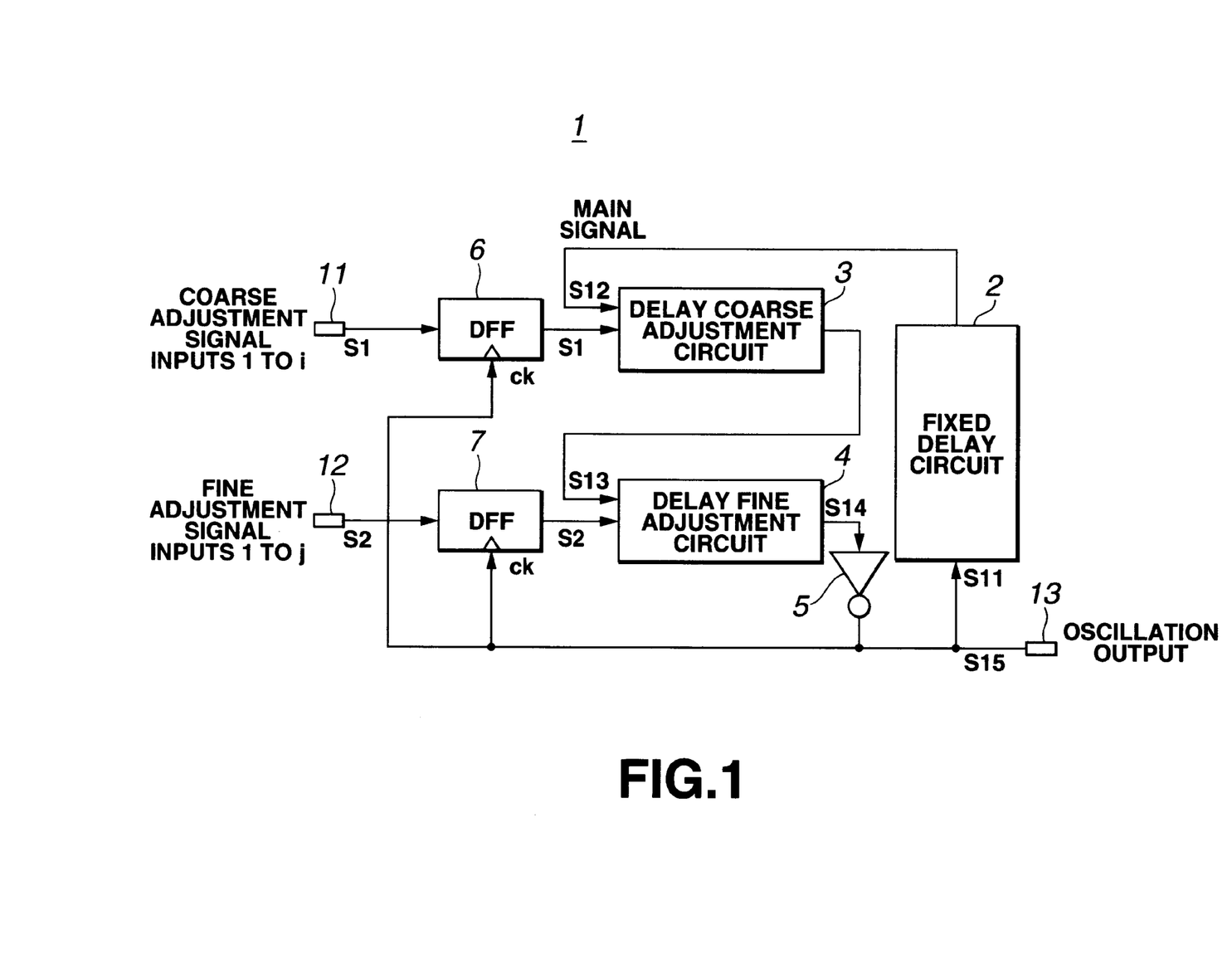
FIG. 1 is a block diagram showing a construction of a signal generator to which the present invention is applied.

The present invention is applied to a signal generator 1 with the construction as shown in FIG. 1, for example. The signal generator 1 has a fixed delay circuit 2, a delay coarse adjustment circuit 3, a delay fine adjustment circuit 4, and an inverter circuit 5 which are connected in a ring. Further, a first D flip-flop (referred to hereafter as DFF) 6 and a second DFF 7 are connected to the delay coarse adjustment circuit 3 and the delay fine adjustment circuit 4 respectively.

The coarse adjustment input terminal 11 comprises i terminals, where i is an integer greater than or equal to 1. The coarse adjustment input terminal 11 is connected to an input terminal of the first DFF 6. The coarse adjustment input terminal 11 outputs a digital coarse adjustment signal S1 to the first DFF 6. The fine adjustment input terminal 12 comprises j terminals, where j is an integer greater than or equal to 1. The fine adjustment input terminal 12 is connected to an input terminal of the second DFF 7. The fine adjustment input terminal 12 outputs a digital fine adjustment signal S2 to the second DFF 7.

The coarse adjustment signal S1 and the fine adjustment signal S2 which are input to the coarse adjustment input terminal 11 and the fine adjustment input terminal 12 indicate delay amounts supplied to a main signal in a delay coarse adjustment circuit 3 and a delay fine adjustment circuit 4 described later. The delay coarse adjustment circuit 3 and the delay fine adjustment circuit 4 adjust a delay in the main signal. The adjusted main signal is output from an oscillation output terminal 13 to become an oscillation output signal S15. A delay amount supplied to a main signal S12 by the delay coarse adjustment circuit 3 is referred to as a coarse delay amount. A delay amount supplied to a main signal S13 by the delay fine adjustment circuit 4 is referred to as a fine delay amount.

The first DFF 6 is provided with output terminals (1 through i) which are connected to coarse adjustment input terminals (1 through i) of the delay coarse adjustment circuit 3. The first DFF 6 outputs the coarse adjustment signal S1 from the coarse adjustment input terminal 11 to the delay coarse adjustment circuit 3.

The second DFF 7 is provided with output terminals (1 through j) which are connected to fine adjustment input terminals (1 through j) of the delay fine adjustment circuit 4. The second DFF 7 outputs the fine adjustment signal S2 from the fine adjustment input terminal 12 to the delay fine adjustment circuit 4.

The delay coarse adjustment circuit 3 is supplied with the coarse adjustment signal S1 from output terminals (1 through i) of the first DFF 6. The delay coarse adjustment circuit 3 is provided with a main signal input terminal connected to the fixed delay circuit 2. The main signal S12 is input to the main signal input terminal of the delay coarse adjustment circuit 3 from the fixed delay circuit 2. Further, the delay coarse adjustment circuit 3 is provided with a main signal output terminal connected to the delay fine adjustment circuit 4.

In the delay coarse adjustment circuit 3, a coarse delay amount stepwise varies at i steps according to the coarse adjustment signal S1 from the first DFF 6. The delay coarse adjustment circuit 3 provides the main signal S12 with a delay for the coarse delay amount based on the input coarse adjustment signal S1. Then, the delay coarse adjustment circuit 3 adds the coarse delay amount to the main signal S12 to form the main signal S13, and outputs it to the delay fine adjustment circuit 4. The delay coarse adjustment circuit 3 will be described later with respect to its construction example, effects, and the like.

The delay fine adjustment circuit 4 is supplied with the fine adjustment signal S2 from output terminals (1 through j) of the second DFF 7. The delay fine adjustment circuit 4 is provided with a main signal input terminal connected to the delay coarse adjustment circuit 3. The main signal S13 is input to the main signal input terminal of the delay fine adjustment circuit 4 from the delay coarse adjustment circuit 3. Further, the delay fine adjustment circuit 4 is provided with a main signal output terminal connected to the inverter circuit 5.

In the delay fine adjustment circuit 4, a fine delay amount stepwise varies at j steps according to the fine adjustment signal S2 from the second DFF 7. The delay fine adjustment circuit 4 provides the main signal S13 with a delay for the fine delay amount which is smaller than the coarse delay amount based on the input fine adjustment signal S2. Then, the delay fine adjustment circuit 4 supplies the main signal S13 with the fine delay amount to form the main signal S14, and outputs it to the inverter circuit 5. The delay fine adjustment circuit 4 will be described later with respect to its construction example, effects, and the like.

The inverter circuit 5 is provided with a main signal input terminal connected to the delay fine adjustment circuit 4. The main signal S14 is input to the main signal input terminal of the inverter circuit 5 from the delay fine adjustment circuit 4. The inverter circuit 5 has output terminals connected to the fixed delay circuit 2, the oscillation output terminal 13, the first DFF 6, and the second DFF 7.

The inverter circuit 5 outputs a main signal S14 from the delay fine adjustment circuit 4 as a main signal S11 to the fixed delay circuit 2. The inverter circuit 5 outputs a main signal as the oscillation output signal S15 to the oscillation output terminal 13. The main signal is also output as a clock signal CK to the first DFF 6 and the second DFF 7.

The fixed delay circuit 2 has a main signal input terminal connected to the main signal output terminal of the inverter circuit 5. The fixed delay circuit 2 also has a main signal output terminal connected to the main signal input terminal of the delay coarse adjustment circuit 3. The fixed delay circuit 2 supplies a delay of the fixed delay amount to the main signal S11 from the inverter circuit 5 to generate the main signal S12. The fixed delay circuit 2 then outputs the main signal S12 to the main signal input terminal of the delay coarse adjustment circuit 3.

The signal generator 1 so constructed as mentioned above is provided with the fixed delay circuit 2, the delay coarse adjustment circuit 3, the delay fine adjustment circuit 4, and the inverter circuit 5 which are connected in series and form a ring oscillator. Consequently, the signal generator 1 can control an oscillation frequency of the oscillation output signal S15 output from the oscillation output terminal 13 stepwise, namely digitally. The first DFF 6 and the second DFF 7 input a signal from the inverter circuit 5 as the clock signal CK. According to the clock signal, the first DFF 6 and the second DFF 7 output the coarse adjustment signal S1 and the fine adjustment signal S2 to the delay coarse adjustment circuit 3 and the delay fine adjustment circuit 4 respectively. Therefore, the signal generator 1 gives a coarse delay and a fine delay to the main signal which is input and output in a ring to generate the oscillation output signal S15.

Figure 2:
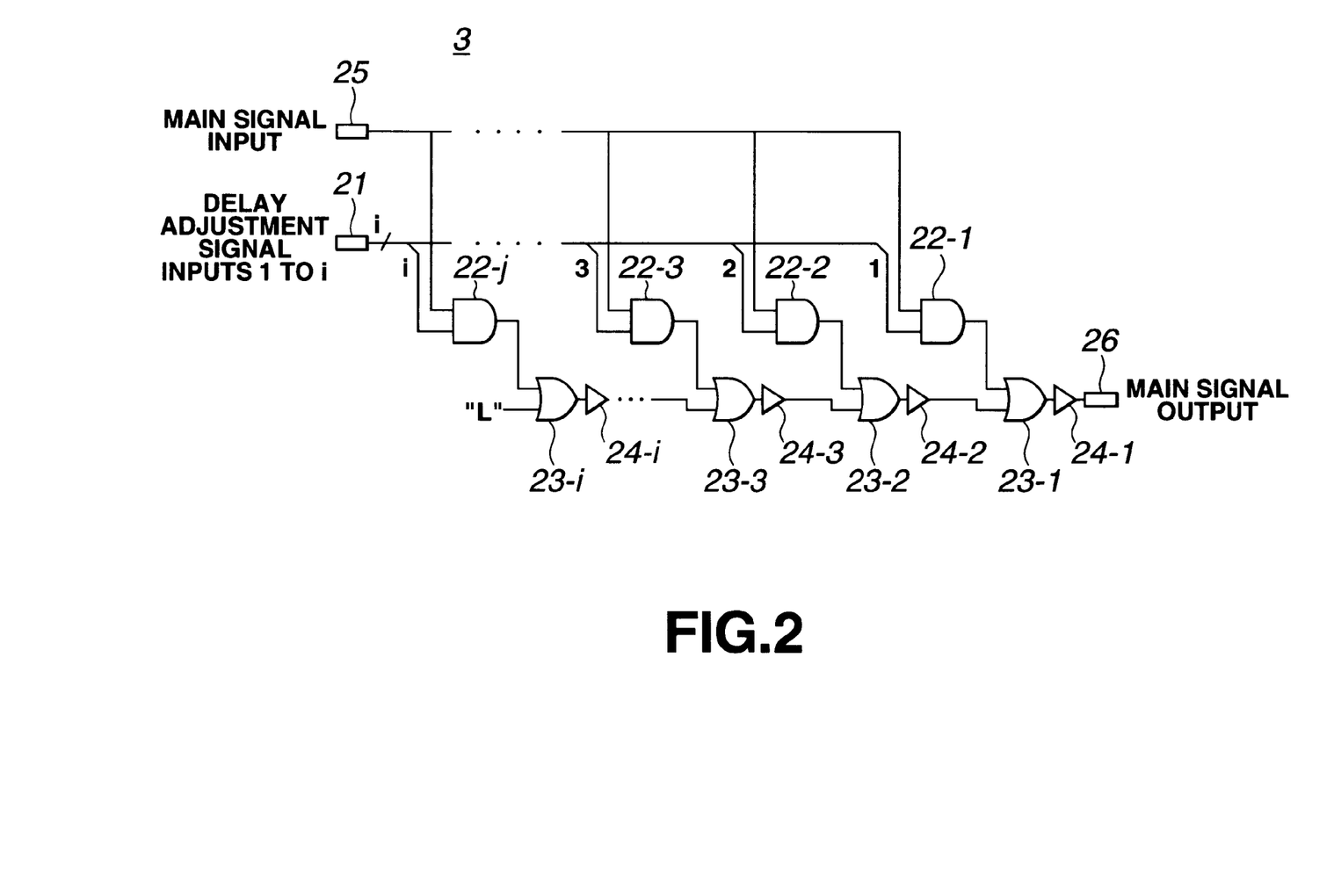
FIG. 2 is a block diagram showing a construction of a delay coarse adjustment circuit provided on the signal generator to which the present invention is applied.

The following describes a construction example of the above-mentioned delay coarse adjustment circuit 3.

As shown in FIG. 2, for example, the delay coarse adjustment circuit 3 comprises AND gates 22-1 through 22-i, OR gates 23-1 through 23-i, and coarse delay circuits 24-1 through 24-i. These AND gates are supplied with the coarse adjustment signal S1 from output terminals (1, 2, 3, . . . and i) of the first DFF 6 via the coarse adjustment input terminal 21.

With respect to each AND gate 22, one input terminal is connected to the coarse adjustment input terminal 21, and other input terminal is connected to the main signal input terminal 25. Each AND gate 22's output terminal is connected to each OR gate 23's one input terminal.

One input terminal of each OR gate 23 is connected to an output terminal of each AND gate 22, and other input terminal is set to an L (Low) level. An output terminal of each OR gate 23 is connected to each coarse delay circuit 24.

An input terminal of each of coarse delay circuits 24-2 through 24-i is connected to each of OR gates 23-2 through 23-i. An output terminal thereof is connected to each of adjacent OR gates 23-1 through 23-(i−1). An output terminal of the coarse delay circuit 24-1 is connected to the main signal output terminal 26.

In this delay coarse adjustment circuit 3, the coarse adjustment input terminal 21 is supplied with the coarse adjustment signal S1 comprising i bits. Of these bits, only one bit is set to an H (High) level. The other bits are set to the L level.

For example, there may be the case where only the nth bit ($1 \leq n < i$) is set to the H level in the coarse adjustment signal S1 input to the coarse adjustment input terminal 21. In this case, the coarse adjustment signal S1 for the nth bit is input to the AND gate 22-n. The AND gate 22-n lets the main signal S12 from the main signal input terminal 25 pass and outputs it to the OR gate 23-n. The main signal S12 input to the OR gate 23-n passes the OR gate 23-n through the OR gate 23-1 and the coarse delay circuit 24-n through the coarse delay circuit 24-1, and is output from the main signal output terminal 26.

It is noted that a delay amount for each coarse delay circuit 24 is assumed to be Tcoarse. Then, a coarse delay amount for the delay coarse adjustment circuit 3 will be Tcoarse×n. A delay for Tcoarse×n is supplied to the main signal S12 which is input to the OR gate 23-n.

On the other hand, there are OR gate 23-n+1 through the OR gate 23-i connected to the AND gate 22 to which the (n+1)th through i-th bits coarse adjustment signal S1 is input. These OR gate are placed outside the ring oscillator pass. Output values thereof are fixed to the L level.

The delay coarse adjustment circuit 3 uses the input coarse adjustment signal S1 for letting a propagated delay for the main signal S12 vary at i steps. On the delay coarse adjustment circuit 3, the delay amount Tcoarse is set so that it matches the maximum delay amount for the delay fine adjustment circuit 4.

The following describes a construction example of the above-mentioned delay fine adjustment circuit 4.

Figure 3:
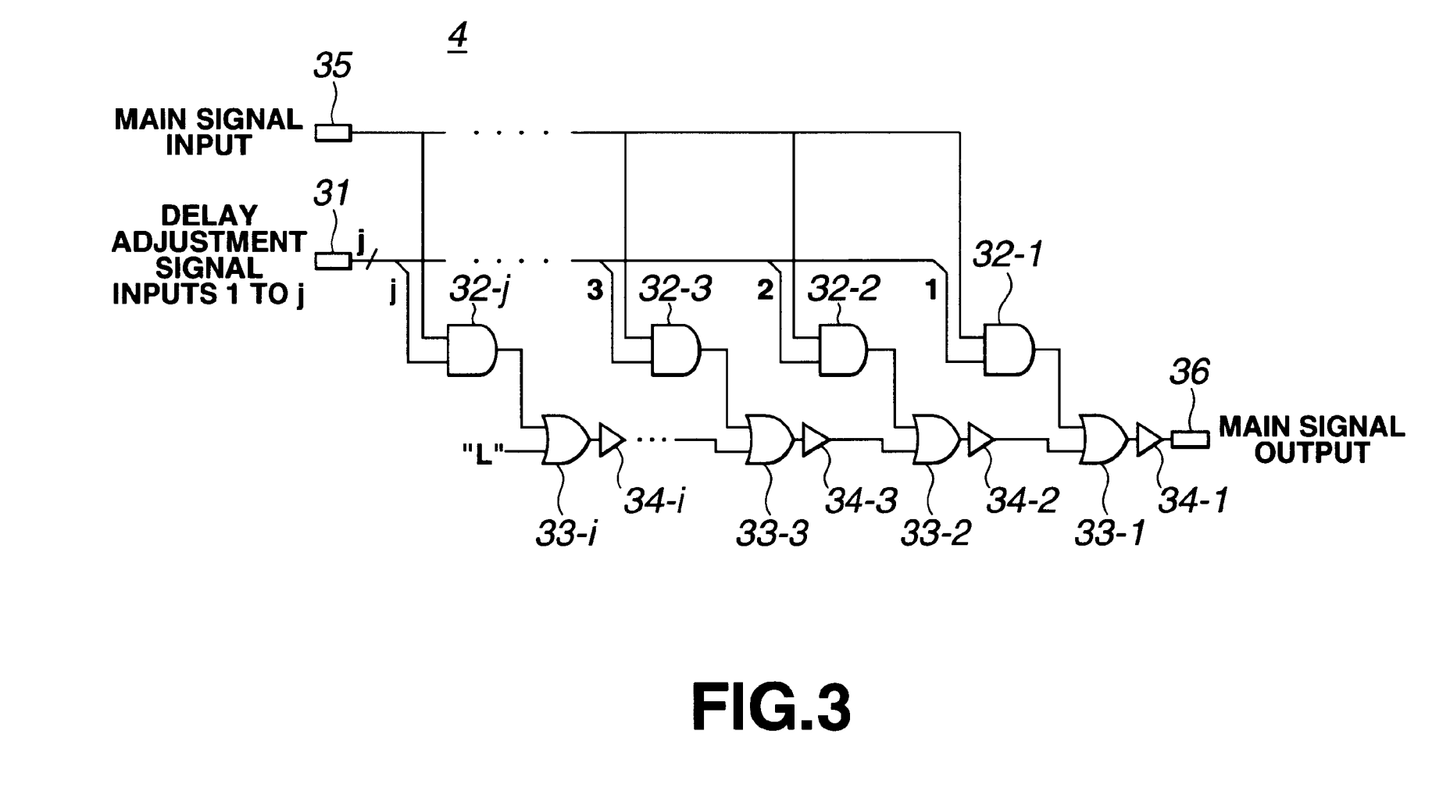
FIG. 3 is a block diagram showing a construction of a delay fine adjustment circuit provided on the signal generator to which the present invention is applied.

The delay fine adjustment circuit 4 has a construction similar to that of the delay coarse adjustment circuit 3 as mentioned above with reference to FIG. 2. As shown in FIG. 3, for example, the fine adjustment input terminal 31 is supplied with the fine adjustment signal S2 from output terminals (1 through j) on the second DFF 7. The delay fine adjustment circuit 4 comprises AND gates 32-1 through 32-j, OR gates 33-1 through 33-j, and fine delay circuits 34-1 through 34-j. These AND gates are supplied with the main signal S13 from the main signal input terminal 35. Each OR gate is connected to an output terminal of each AND gate 32. Each fine delay is connected to an output terminal of each OR gate 33. The main signal S14 is supplied with a fine delay amount and is output to the inverter circuit 5.

In this delay fine adjustment circuit 4, the fine adjustment input terminal 31 is supplied with the fine adjustment signal S2 comprising j bits. Of these bits, only one bit is set to the H level. The other bits are set to the L level.

For example, there may be the case where only the mth bit ($1 \leq m < j$) is set to the H level in the fine adjustment signal S2 and this signal is input to the fine adjustment input terminal 31. In this case, the fine adjustment signal S2 for the mth bit is input to the AND gate 32-m. The AND gate 32-m lets the main signal S13 from the main signal input terminal 35 pass and outputs it to the OR gate 33-m. The main signal S13 input to the OR gate 33-m passes the OR gate 33-m through the OR gate 33-1 and the coarse delay circuit 34-m through the coarse delay circuit 34-1, and is output from the main signal output terminal 36.

It is noted that a delay amount for each fine delay circuit 34 is assumed to be Tfine. Then, a fine delay amount for the delay fine adjustment circuit 4 will be Tfine×m. A delay for Tfine×m is supplied to the main signal S13 which is input to the OR gate 33-m.

On the other hand there are OR gate 33-m+1 through 33-j to which the (m+i)th through j-th bits fine adjustment signal S2 is input. These OR gates are placed outside the ring oscillator pass. Output values thereof are fixed to the L level.

The delay fine adjustment circuit 4 uses the input fine adjustment signal S2 for letting a propagated delay for the main signal S13 vary at j steps. On the delay fine adjustment circuit 4, each delay amount Tfine is set so that the maximum delay amount for the delay fine adjustment circuit 4 matches a delay amount for one step of the delay coarse adjustment circuit 3.

As mentioned above, FIGS. 2 and 3 are used for explaining the delay coarse adjustment circuit 3 and the delay fine adjustment circuit 4. The following relationship must be maintained when setting the delay amount Tcoarse for each coarse delay circuit 24 on the delay coarse adjustment circuit 3 and setting the delay amount Tfine for each fine delay circuit 34 on the delay fine adjustment circuit 4.

$$Tfine < Tcoarse$$

For example, it is desirable to set Tfine and Tcoarse as follows in order to fine adjust delays with evenly high precision within all delay adjustment ranges applicable to the signal generator 1.

$$Tfine = Tcoarse/(j+1)$$

The delay amount Tcoarse values differ among the coarse delay circuits 24. To equalize these Tcoarse values, the following setting is used according to the delay amount Tfine of each fine delay circuit 34.

$$Tfine < Tcoarse/(j+1)$$

This setting provides finer adjustment of delays.

The following describes an operation of the above-mentioned signal generator 1.

The signal generator 1 having the above-mentioned construction provides a ring oscillator comprising the fixed delay circuit 2, the delay coarse adjustment circuit 3, the delay fine adjustment circuit 4, and the inverter circuit 5. The signal generator 1 oscillates on the basis of a cycle which is twice a total delay time for the fixed delay circuit 2, the delay coarse adjustment circuit 3, the delay fine adjustment circuit 4, and the inverter circuit 5.

On the signal generator 1 as shown in FIGS. 4A~4F, a rising edge occurs at time $t_1$ in an oscillation output (FIG. 4A) from the inverter circuit 5. This oscillation output is the clock signal CK which is input to the first DFF 6 and the second DFF 7. The coarse adjustment signal S1 and the fine adjustment signal S2 are incorporated into the first DFF 6 and the second DFF 7. These signals are then input to the delay coarse adjustment circuit 3 and the delay fine adjustment circuit 4 for performing delay changeover control.

In FIG. 4, time $t_2$ means the time when the delay control terminates. An interval from $t_1$ to $t_2$ is assumed to be $Td_1$. Also in FIG. 4, time $t_3$ means the time when the fixed delay circuit 2 outputs a rising edge in the oscillation output. A delay time from $t_1$ to $t_3$ is assumed to be $Td_2$. The following relationship should be maintained when setting the delay amount Tc for the fixed delay circuit 2.

$$Td_1 \leq Td_2$$

Thus setting the fixed delay amount Tc allows the delay changeover control to perform during the time $Td_2$. The delay changeover control changes the coarse delay amount setting at steps 1 through i in the delay coarse adjustment circuit 3. It also changes the fine delay amount setting at steps 1 through j in the delay fine adjustment circuit 4.

Namely, the delay coarse adjustment circuit 3 and the delay fine adjustment circuit 4 maintain the L level when neither the main signal S12 nor the main signal S13 is input. During this L level, a rising edge may occur at time $t_1$ in the oscillation output, namely in the clock signal CK which is input to the first DFF 6 and the second DFF 7. At time t2, as shown in FIG. 4E and FIG. 4F, the first DFF 6 outputs the coarse adjustment signal S1 from the coarse adjustment input terminal 11 to the delay coarse adjustment circuit 3. As mentioned above, time $t_2$ should be measured at an elapsed time of $Td_1$ from $t_1$. In addition, the second DFF 7 outputs the fine adjustment signal S2 from the fine adjustment signal input terminal 12 to the delay fine adjustment circuit 4. In response to this operation, the delay coarse adjustment circuit 3 performs the delay changeover control for changing the coarse delay amount based on the coarse adjustment signal S1, and the delay fine adjustment circuit 4 performs the delay changeover control for changing the fine delay amount based on the fine adjustment signal S2.

Figure 4A:
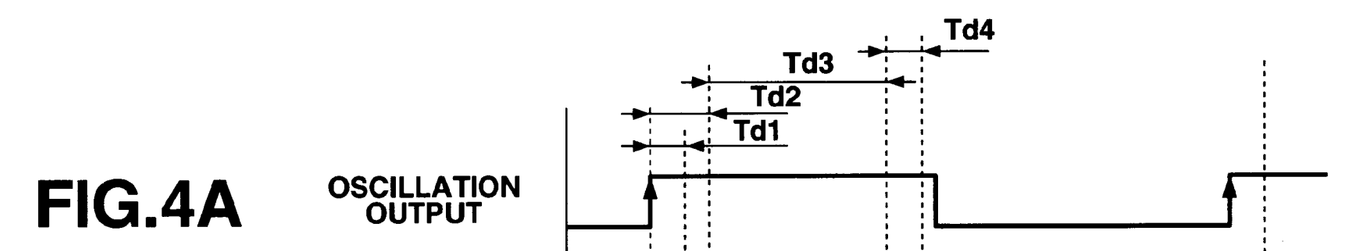
FIGS. 4A–4F are timing charts for explaining an operation of the signal generator to which the present invention is applied.
Figure 4B:
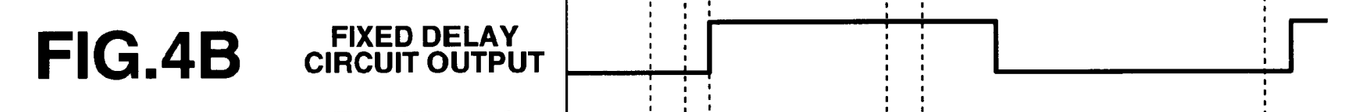
Figure 4C:
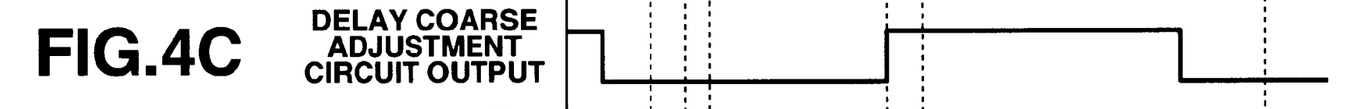
Figure 4D:
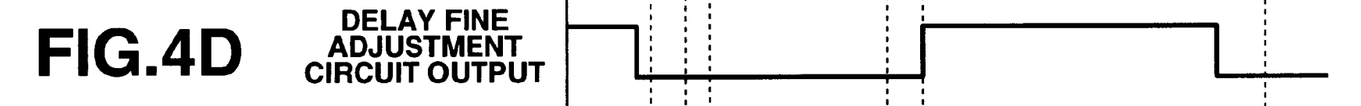
Figure 4E:
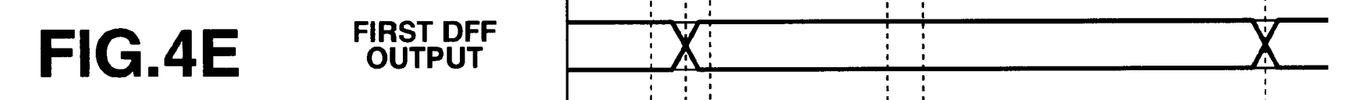
Figure 4F:
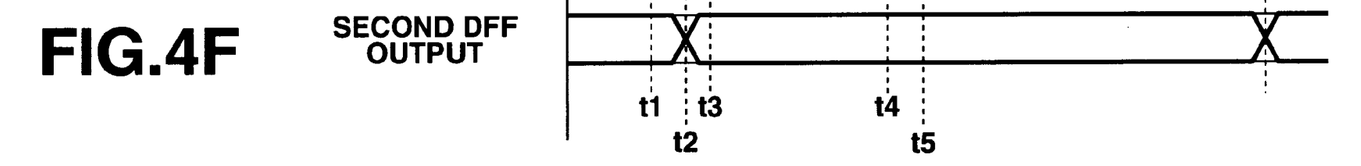

At time $t_3$ as shown in FIG. 4B, the fixed delay circuit 2 outputs the main signal S12 to the delay coarse adjustment circuit 3. Time $t_3$ should be measured at an elapsed time of $Td_2$ from time $t_1$. At time $t_4$ as shown in FIG. 4C, the delay coarse adjustment circuit 3 outputs the main signal S13 to the delay fine adjustment circuit 4. Time $t_4$ should be measured at an elapsed time of delay time $Td_3$ from time $t_3$. The delay time $Td_3$ corresponds to a coarse delay amount specified at time $t_2$. At time $t_5$ as shown in FIG. 4D, the delay fine adjustment circuit 4 outputs the main signal S14 to the inverter circuit 5. Time $t_5$ should be measured at an elapsed time of delay time $Td_4$ from time $t_4$. The delay time $Td_4$ corresponds to a fine delay amount specified at time $t_2$.

The signal generator 1 operating as mentioned above sets the delay time $Td_2$ so that it becomes longer than or equal to the delay time $Td_1$. The delay time $Td_2$ corresponds to the fixed delay amount Tc for the fixed delay circuit 2. Before the fixed delay circuit 2 outputs the main signal S12 to the delay coarse adjustment circuit 3, the delay changeover control is complete in the delay coarse adjustment circuit 3 and the delay fine adjustment circuit 4. This prevents the main signal S12 or S13 from being input to the delay coarse adjustment circuit 3 or the delay fine adjustment circuit 4 during execution of the delay changeover control.

Accordingly, the signal generator 1 prevents a noise which may occur due to execution of the delay changeover control when a delay is applied to the main signal. It is possible to generate the noiseless oscillation output signal S15.

This signal generator can provide precision delay control by combining the delay coarse adjustment circuit 3 and the delay fine adjustment circuit 4. It is possible to implement a delay circuit for generating oscillation output signals with precision oscillation frequencies by using a small-scale hardware configuration.

Further according to the signal generator 1, for example, the delay coarse adjustment circuit 3 controls coarse delay amounts at i steps. The delay fine adjustment circuit 4 controls fine delay amounts at j steps. Accordingly, it is possible to be configured by a completely digital circuit. So a process of mounting the circuit, say, on a digital LSI chip is simplified, and manufacturing cost is decreased.

What is claimed is:
1. An oscillator comprising:
   a delay coarse adjustment circuit for stepwise varying a delay amount based on a delay coarse adjustment signal and supplying an input oscillation signal with a coarse delay;

a delay fine adjustment circuit for stepwise varying a delay amount based on a delay fine adjustment signal and supplying the input oscillation signal with a fine delay which is smaller than the delay amount supplied by the delay coarse adjustment circuit, wherein the delay fine adjustment circuit comprises a plurality of buffers connected in series;

an inverter circuit for inputting an oscillation signal which has passed the delay coarse adjustment circuit and the delay fine adjustment circuit; and wherein the delay coarse adjustment circuit, the delay fine adjustment circuit, and the inverter circuit are connected in a ring and control an oscillation frequency of the oscillation signal; and a delay changeover control for controlling at least one of the delay coarse adjustment circuit and the delay fine adjustment circuit to vary the coarse delay or fine delay at a predetermined time with respect to the oscillation signal.

2. The oscillator according to claim 1, further comprising:

a fixed delay circuit which is connected in the ring together with the delay coarse adjustment circuit, the delay fine adjustment circuit, and the inverter circuit and supplies the input oscillation signal with a predetermined amount of delay; and wherein the delay changeover control comprises:

a switch circuit which outputs the delay coarse adjustment signal and the delay fine adjustment signal to the delay coarse adjustment circuit and the delay fine adjustment circuit by using the oscillation signal as a clock; and wherein the delay coarse adjustment signal and the delay fine adjustment signal being output from the switch circuit to the delay coarse adjustment circuit and the delay fine adjustment circuit for varying a delay amount in the delay coarse adjustment circuit and the delay fine adjustment circuit, are output during a delay time corresponding to the predetermined delay amount of said fixed delay circuit.

3. The oscillator according to claim 1, wherein the delay coarse adjustment circuit comprises a plurality of buffers connected in series for supplying the input oscillation signal with a delay of a unit coarse delay amount which is equivalent to one of equally divided delay amounts for the coarse delay; wherein each of the plurality of buffers comprising the delay fine adjustment circuit supplies a unit fine delay amount which is equivalent to one of equally divided delay amounts for the fine delay; and the delay coarse adjustment circuit and the delay fine adjustment circuit vary the number of buffers to be passed corresponding to the delay coarse adjustment signal and the delay fine adjustment signal.

4. An oscillation method comprising the steps of:

supplying an oscillation signal with a coarse delay by stepwise varying a delay amount in a delay coarse adjustment circuit based on a delay coarse adjustment signal;

supplying the oscillation signal with a fine delay which is smaller than the coarse delay by stepwise varying a delay amount in a delay fine adjustment circuit based on a delay fine adjustment signal, wherein the delay fine adjustment circuit comprises a plurality of buffers connected in series; and stepwise controlling an oscillation frequency of the oscillation signal by letting this signal at least once pass the delay coarse adjustment circuit, the delay time adjustment circuit, and an inverter circuit which are connected in a ring, wherein at least one of the delay coarse adjustment circuit and the delay fine adjustment circuit are controlled to vary the coarse delay or fine delay at a predetermined time with respect to the oscillation signal.

5. The oscillation method according to claim 4, wherein a fixed delay circuit is arranged to supply the oscillation signal with a specified amount of delay;

wherein the delay coarse adjustment circuit and the delay fine adjustment circuit are supplied with the delay coarse adjustment signal and the delay fine adjustment signal, respectively, to vary a delay amount in the delay coarse adjustment circuit and the delay fine adjustment circuit, wherein the predetermined time is a time while an edge of the oscillation signal is transferred in the fixed delay circuit; and wherein the delay coarse adjustment circuit and the delay fine adjustment circuit are arranged to supply the oscillation signal, respectively, with the coarse delay and the fine delay.

6. The oscillation method according to claim 4, wherein the delay coarse adjustment circuit is controlled so as to vary a number of buffers to be passed in accordance with the delay coarse adjustment signal, wherein each buffer provides the oscillation signal with a delay of a unit coarse delay amount which is equivalent to one of equally divided delay amounts for the coarse delay; and the delay fine adjustment circuit is controlled so as to vary a number of buffers to be passed in accordance with the delay fine adjustment signal, wherein each of the buffers comprising the delay fine adjustment circuit provides the oscillation signal with a unit fine delay which is equivalent to one of equally divided delay amounts for the fine delay.

* * * * *